(12) United States Patent
Groen et al.

(10) Patent No.: US 6,172,502 B1
(45) Date of Patent: Jan. 9, 2001

(54) METHOD OF AND DEVICE FOR IMAGING BY MEANS OF MAGNETIC RESONANCE

(75) Inventors: Johannes P. Groen; Arianne M. C. Van Muiswinkel; Gerald Van Ensbergen, all of Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/029,531
(22) PCT Filed: Apr. 23, 1997
(86) PCT No.: PCT/IB97/00433
    § 371 Date: Feb. 27, 1998
    § 102(e) Date: Feb. 27, 1998
(87) PCT Pub. No.: WO98/01765
    PCT Pub. Date: Jan. 15, 1998

(30) Foreign Application Priority Data

Jul. 8, 1996 (EP) .................................................. 96201898

(51) Int. Cl.[7] ...................................................... G01V 3/00
(52) U.S. Cl. ............................................ 324/307; 324/309
(58) Field of Search .................................... 324/309, 307, 324/306, 312, 314

(56) References Cited

U.S. PATENT DOCUMENTS

| | | | |
|---|---|---|---|
| 5,581,181 | * 12/1996 | Fuderer | 324/309 |
| 5,647,362 | *  7/1997 | Fuderer et al. | 324/309 |
| 5,942,897 | *  8/1999 | Kanazawa | 324/309 |

FOREIGN PATENT DOCUMENTS

0490528A1    6/1992   (EP) .

\* cited by examiner

*Primary Examiner*—Louis Arana
(74) *Attorney, Agent, or Firm*—John F. Vodopia (57) ABSTRACT

According to the known method, a reference measurement is performed by measurement of magnetic resonance signals, without application of a magnetic gradient field to introduce phase encoding in the magnetic resonance signals. According to the invention, two measurements are performed with a read-out gradient of opposite polarity at substantially corresponding instants, relative to an instant at which the contributions to the phase error due to frequency deviations are zero. The advantage of the novel method resides in the fact that a higher insensitivity to field inhomogeneities and chemical shifts is achieved.

19 Claims, 4 Drawing Sheets

METHOD OF AND DEVICE FOR IMAGING BY MEANS OF MAGNETIC RESONANCE

The invention relates to a method of forming a magnetic resonance image of a part of a body situated in a static magnetic field by:

a. generating a magnetic resonance signal by means of an excitation RF pulse and gradients, in which b. a measuring set of signal values is obtained by application of a read-out gradient in a first direction with an alternating polarity and further gradients on the magnetic field and the simultaneous measurement of the generated magnetic resonance signal at measuring points along substantially parallel lines in the k-space, and in which a phase correction of the measuring set is determined by measuring a reference set of signal values, c. determining an image by transformation and correction of phase errors of the measuring set of signal values.

The invention also relates to a magnetic resonance device for performing this method of forming magnetic resonance images of objects.

A method of the kind set forth is known from EP-A-490528. In the cited Application the excitation RF pulse is understood to be an RF pulse for exciting nuclear spins in a part of the body. The gradients are to be understood to mean additional, temporary magnetic gradient fields whose respective directions extend perpendicularly to one another. One of said gradients is the read-out gradient which is oriented in the first direction. Furthermore, in an Echo-Planar-Imaging (EPI) pulse sequence the read-out gradient has an alternating polarity. The part of the read-out gradient between two polarity reversals is referred to as a lobe of the read-out gradient. A lobe of positive polarity is called a positive lobe and a lobe of negative polarity a negative lobe. Furthermore, one of the other said gradients, whose direction extends transversely of the direction of the read-out gradient, is referred to as a phase encoding gradient. This phase encoding gradient is used for phase encoding of the magnetic resonance signal. Furthermore, the k-space in the cited Application designates a spatial frequency domain in which the magnetic resonance signal is measured along a trajectory and the measured values yield the inverse Fourier transform of the image. The trajectory in the k-space is determined by the time integral of the applied gradients over the time interval from the excitation pulse until the measuring instant.

If the time is too short to measure an adequate number of signal values, the generating of magnetic resonance signals can be repeated by means of additional RF pulses and gradients for the measurement of further signal values.

The phase of magnetic resonance signals is influenced by delays in the RF receiver, the system generating the gradient, and time constants upon the switching of the read-out gradient. After Fourier transformation, the phase errors thus caused become manifest as image artefacts. In order to determine phase errors, the known method measures signal values for a reference set by generating a magnetic resonance signal by means of a pulse sequence which is identical, except for the absence of a phase encoding gradient, to the pulse sequence used to generate the magnetic resonance signal for measuring the signal values of the measuring set. Subsequently, a phase correction is derived from the reference set. Upon reconstruction of an image, the transformed signal values of the measuring set for positive and/or negative lobes of the read gradient are corrected by the phase correction derived from the reference set. Finally, an image is derived by further transformation. It is a drawback of this method that the phase corrections determined may have been influenced by local frequency deviations due to field inhomogeneities or chemical shifts, so that they cannot be corrected in the described manner because the position-dependency of the local frequency deviations is not fully known from the one-dimensionally encoded reference set of resonance signals.

It is inter alia an object of the invention to provide a method which counteracts the contribution of local frequency deviations to the phase correction. To this end, the method according to the invention is characterized in that a first and a second series of signal values of the reference set are measured with opposite polarity of the read-out gradient and at substantially corresponding instants, relative to an instant at which phase errors due to local frequency deviations are zero, the phase corrections being derived from the first and the second series of signal values. The information for executing said phase corrections is obtained by using, during measurement of corresponding signal values, read-out gradient lobes of opposite polarity at corresponding instants for the two series of signal values of the reference set, and by determining the phase difference between the corresponding signal values. As a result of this step, the phase error contributions caused by local frequency deviations are equal for corresponding measurements of the two series of signal values, and hence do not contribute to the phase difference. As a result, the determination of the phase error due to delays in the RF receiver and time constants in systems for generating the gradients, necessary for the correction methods to be used, becomes more accurate. The method of the invention offers the advantage that the phase error is insusceptible to local frequency deviations caused by field inhomogeneities and chemical shifts. A further advantage consists in that other methods of counteracting the effects of local frequency deviations on the images derived can be used in combination with said step, for example a method as mentioned in "Interference between echo time shifting and correction scans in multi-shot EPI and GRASE pulse sequences", by J. P. Mugler, published in Abstracts SMR 1995, page 758. The cited article describes a method in which a time shift of the read-out gradient is used in a GRASE method and a multi-shot EPI method.

A special version of the method according to the invention is characterized in that the read-out gradients exhibit the same variation in time but are of opposite polarity during the measurement of the two series of signal values of the reference set. The read-out gradient for measuring the second series of the reference set can thus be simply derived from the read-out gradient used for measuring the first series of the reference set.

A further version of the method according to the invention is characterized in that, except for a time shift, the read-out gradients are the same as a function of time during the measurement of the two series of signal values of the reference set. This step is taken preferably if, due to the reversal of the polarity of the read-out gradient, phase differences occur in the two series of signal values other than those for which the correction is suitable. This effect occurs if upon switching of the read-out gradient not only the effects to be corrected, having short time constants with respect to a lobe of the read-out gradient, occur but also effects with a longer time constant with respect to the duration of a lobe of the read-out gradient. In the latter case the effects do not offer a suitable estimate as regards the phase differences between the transformed signals for the positive and the negative lobes of the read-out gradient.

A further version of the method of the invention is characterized in that the reference set is measured in at least one two-dimensional sub-space of the k-space. This step is used preferably when the phase errors to be corrected also have a position-dependency in a direction perpendicular to the direction of the read-out gradient. The advantage of this step resides in the fact that the reference set then also contains information concerning said phase errors with a position-dependency in a direction perpendicular to the read-out gradient. This method is known per se from EP-A-644437.

A further version of the invention is characterized in that a refocusing RF pulse is applied subsequent to the excitation RF pulse. In a refocused magnetic resonance signal more time is available for the measurement of signal values than in the "free induction decay" signal which directly succeeds the excitation RF pulse. Moreover, the effect of inhomogeneities in the static magnetic field is less.

A further version of the method of the invention is characterized in that a further refocusing RF pulse is applied and that the signals of the first series of the reference set are measured after the refocusing RF pulse and the signals of the second series of the reference set are measured after the further refocusing RF pulse. This step simplifies the realization of equal phase deviations for the two series of measuring values.

The invention also relates to a device for magnetic resonance imaging which is arranged to execute the methods described above. According to the invention, a device of this kind is characterized in that it includes a control unit which is arranged to measure a first and a second series of signal values of the reference set with opposite polarity of the read-out gradient and at substantially the same instants relative to an instant at which phase errors due to local frequency deviations are zero, the phase corrections being derived from the first and the second series of signal values.

These and other aspects of the invention will be apparent from and elucidated with reference to the embodiments described hereinafter.

Figure 1:
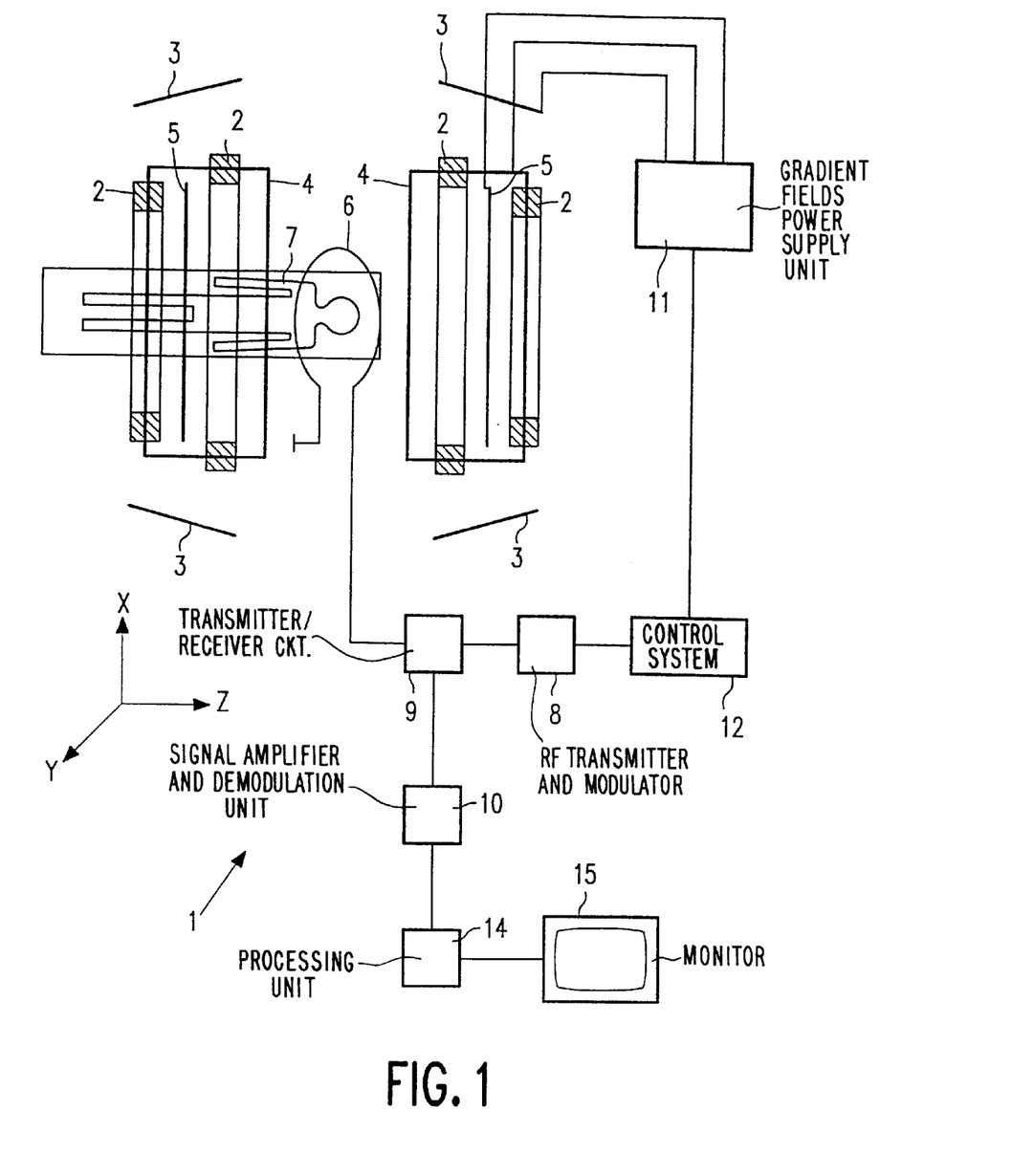
FIG. 1 shows a magnetic resonance device for the imaging of objects.

FIG. 1 shows a magnetic resonance device which includes a first magnet system 2 for generating a static magnetic field, and also various gradient coils 3, 4, 5 for generating additional magnetic fields having gradients in the X, Y, Z directions. As is customary, the Z-direction of the coordinate system shown corresponds to the direction of the static magnetic field in the magnet system 2. The measuring coordinate system x, y, z to be used can be chosen independently of the X, Y, Z system shown in FIG. 1. The gradient coils 3, 4, 5 are fed by the supply unit 11. An RF transmitter coil 6 serves to generate RF magnetic fields and is connected to an RF transmitter and modulator 8. A receiver coil serves to receive the magnetic resonance signal generated by the RF field in the object 7 to be examined, for example a patient. The receiver coil may be the same coil as the RF transmitter coil 6. The magnet system 2 encloses an examination zone which is large enough to receive a part of the patient 7 to be examined. The RF transmitter coil 6 is arranged around (a part of) the patient 7 within the examination zone. The RF transmitter coil 6 is connected to a signal amplifier and demodulation unit 10 via a transmitter-lreceiver circuit 9. The control unit 12 controls a modulator 8 for the RF transmitter and the power supply unit 11 for generating special pulse sequences with RF pulses and gradients. The phase and amplitude obtained from the demodulation unit 10 are applied to a processing unit 14. The processing unit 14 processes the signal values received so as to form an image by transformation. This image can be reproduced, for example on a monitor 15. A more detailed description of magnetic resonance imaging and magnetic resonance devices can be found in the relevant literature.

Figure 2:
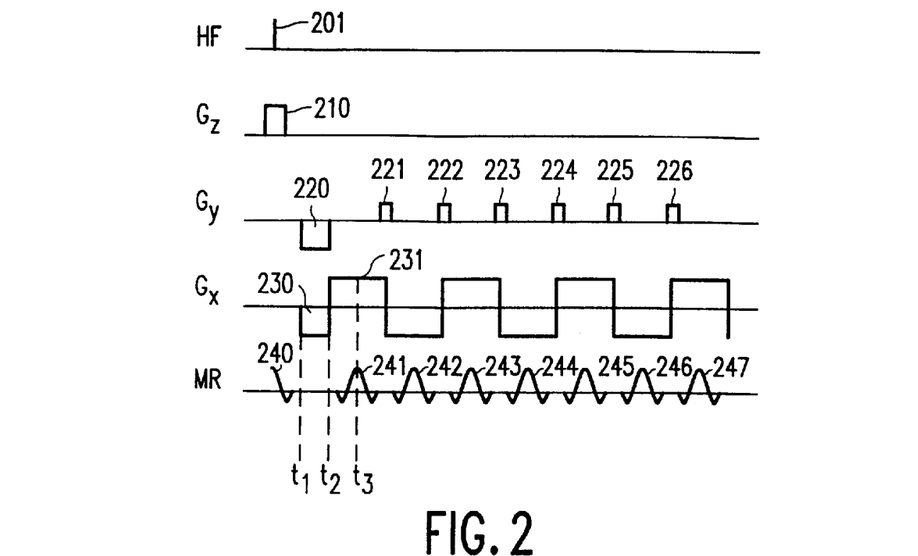
FIG. 2 shows a known EPI pulse sequence.

The invention relates inter alia to a known Echo-Planar Imaging (EPI) pulse sequence for generating a magnetic resonance signal. The known pulse sequence is used in, for example a two-dimensional or three-dimensional Fourier imaging technique. FIG. 2 shows a known EPI pulse sequence 200. The EPI pulse sequence 200 commences with an excitation RF pulse 201 having a flip angle α, indicated on line HF in FIG. 2, simultaneously with a gradient 210 in the z- direction which is indicated on line $G_z$. The flip angle α is, for example 90°. The excitation RF pulse 201 generates a first magnetic resonance signal 240 in a slice perpendicular to the z-direction. In FIG. 2 this magnetic resonance signal is shown on line MR. Subsequently, at the instant $t_1$ there is applied a dephasing gradient 230 with a gradient oriented in the negative x-direction. The first magnetic resonance signal 240 then decays rapidly due to the dephasing of the individual nuclear spins. At the instant $t_2$ there is applied a read-out gradient 231 of alternating polarity, the gradient being oriented alternately in the positive and in the negative direction. The dephasing gradient 230 is referred to as the initial read-out gradient. The applied gradient 231 reverses the direction of the individual nuclear spins. Consequently, dephasing is transformed into rephasing, so that at an instant $t_3$ a gradient echo signal 241 arises, followed by further dephasing. The integral of the read-out gradient over the time interval equal to the duration of this lobe equals minus twice the integral of the initial read-out gradient over the duration of the initial gradient. Each subsequent lobe causes a further gradient echo signal, thus producing a series of gradient echo signals 241, 242, 243, 244, 245, 246, 247. In practice, for example 64 or 128 gradient echo signals are generated during a single EPI pulse sequence.

Figure 3:
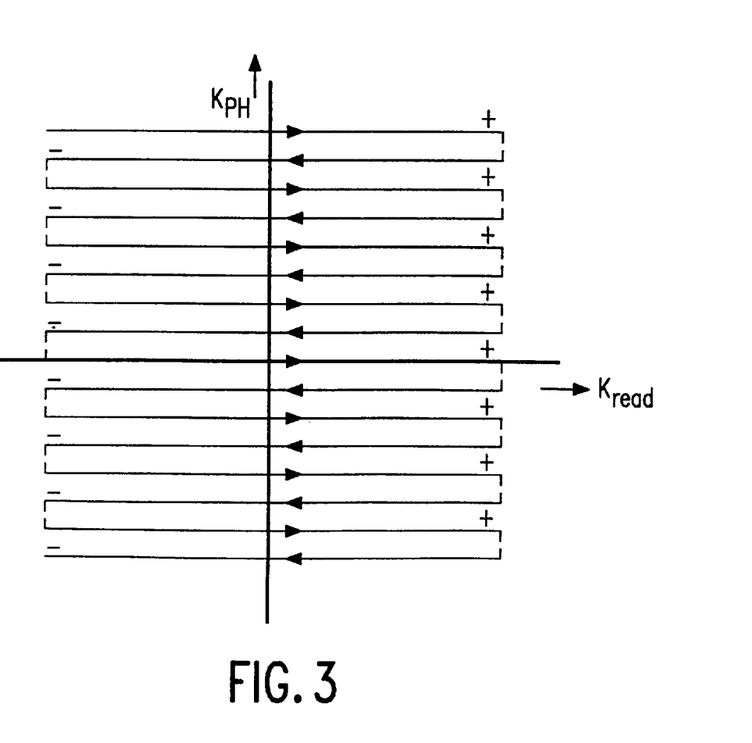
FIG. 3 shows the lines in the k-space in the case of an EPI pulse sequence.

During application of the initial read-out gradient 230, furthermore, a gradient 220 is applied in the y-direction in order to introduce phase encoding in the magnetic resonance signal. The gradient 220 is referred to as the initial phase encoding gradient. Upon reversal of the polarity of the read-out gradient, furthermore, a phase encoding gradient pulse (blip) 221, 222, 223, 224, 225, 226 is applied, so that the gradient echo signals 241, 242, 243, 244, 245, 246, 247 are measured along a trajectory containing lines which are regularly distributed in the part of the k- space to be measured and extend parallel to the $k_x$-axis. After each phase encoding gradient pulse, a gradient echo signal is generated whose measured signal values correspond to a next line forming part of the trajectory in the k-space. FIG. 3 shows the trajectory in the k-space along which the magnetic resonance signal is measured, the magnetic resonance signal having been generated by means of an EPI pulse sequence. The trajectory contains a number of parallel lines in the k-space. The lines in the k-space are graphic representations of the values of an integral of the gradients over the time interval from the excitation RF pulse until the measuring instants. FIG. 3 shows a read-out gradient of positive polarity which is denoted by the symbol "+" and a read-out gradient of negative polarity which is denoted by the symbol "−". During the period in which the read-out gradient has a positive polarity, the signal values are measured in chronological order from left to right and the signal values are measured from right to left when the read-out gradient is of negative polarity. In the case of a multi-shot EPI method, a smaller number of gradient echo signals is generated, for example 15, after which the pulse sequence is repeated with a different value of the initial phase encoding gradient 220 for measurement of the magnetic resonance signal at measuring points situated along intermediate lines in the k-space.

FIG. 3 shows an ideal situation in which the positive as well as the negative lobes of the read-out gradient are identical and are exactly temporally related to the measuring points. In practice, however, delays occur in the RF receiver and also upon switching of the alternating read-out gradient 231. Moreover, the switching of the alternating read-out gradient could cause eddy currents in metal parts of the system. Such eddy currents cause additional field contributions with different time constants. Consequently, time delays and phase differences occur in the gradient echo signals measured with read-out gradients of positive and negative polarity. These phase differences cause artefacts in the reconstructed images, for example echo images. Known phase correction methods, such as a phase correction method which is known from the cited document EP-A-490528, utilize a reference measurement during which a set of gradient echo signals is measured without phase encoding gradient. This reference set is used to derive phase errors between the measuring values measured with a read-out gradient of positive polarity and the measuring values measured with a read-out gradient of negative polarity.

It is a problem of the known phase correction that it utilizes a number of gradient echo signals which arise at different instants after the RF pulse or pulses exciting the nuclear spins. This implies that nuclear spins contributing to these gradient echo signals have experienced different phase shifts due to their frequency deviation caused by chemical shift and local deviations of the static magnetic field from the nominal value. This is due to the fact that the instant at which the various gradient echos are measured differs with respect to the RF pulse or pulses whereby the nuclear spins are excited. This effect of chemical shifts and local field deviations on the phase correction is undesirable, as has already been explained in the cited reference "Interference between echo time shifting and correction scans in multi-shot EPI and GRASE pulse sequences", by J. P. Mugler, published in Abstracts SMR, 1995, page 758. This problem is solved by the method of the invention in that the phase correction is derived from two gradient echo signals from the set of reference measurements which have been measured at substantially corresponding instants relative to an instant at which the phase errors due to local frequency deviations are zero. This will be explained on the basis of an example utilizing two separate excitation RF pulses for generating the two gradient echo signals. Subsequent to the first excitation RF pulse, a read-out gradient is applied and a first series of gradient echo signals is measured. Subsequently, a second excitation RF pulse is applied and a second series of gradient echos is measured, the polarity of the read-out gradient then opposing that of the read-out gradient applied during the measurement of the first series of gradient echos. The signal values obtained from corresponding measuring points in the two series of gradient echo signals have in this case been measured at substantially corresponding instants relative to an instant at which phase errors due to local frequency deviations are zero. As a result, the contribution to the phase errors of the nuclear spins due to local field deviations and chemical shift is substantially the same for corresponding measuring values of the two series. After Fourier transformation of the two series of signal values, the phase error for an echo (i) of the series is derived from the formula $\Phi_i(x)=\arg(S_i^-(x)S_i^{+*}(x))$, in which * is the complex conjugate value, $S_i^-(x)$ is the Fourier transformed signal of the first series, measured with a negative lobe of the read-out gradient, and $S_i^-(x)$ is the Fourier transformed signal of the second series, measured with a positive lobe of the read-out gradient.

Figure 4:
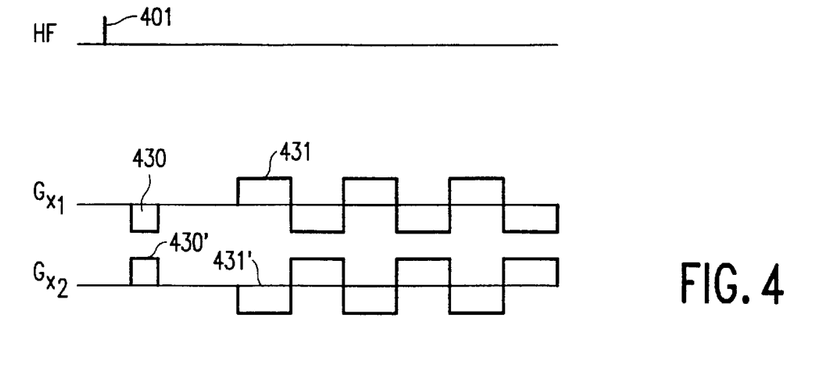
FIG. 4 shows the read-out gradients of a first method for executing EPI reference measurements.
Figure 5:
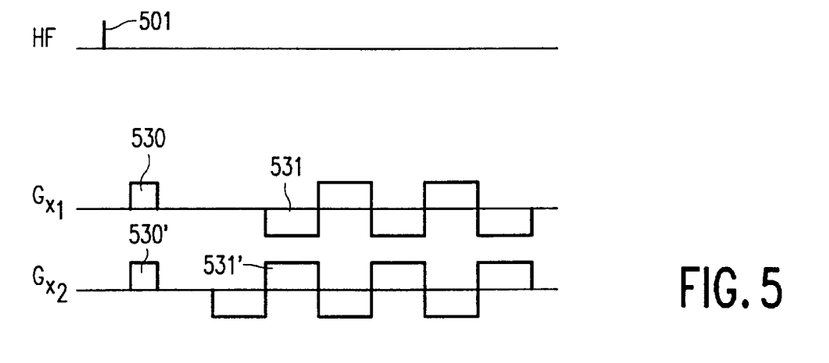
FIG. 5 shows the read-out gradients of a second method for executing EPI reference measurements.

FIG. 4 shows a first example of the read-out gradients of pulse sequences for executing an EPI reference measurement according to the invention. The line HF in FIG. 4 shows the RF pulse 401 and is identical to the line HF of FIG. 2. Furthermore, line $G_{x1}$, shows the read-out gradient 431 used for measuring the first series of signal values, and line $G_{x2}$ shows the read-out gradient 431' used for measuring the second series of signal values. As appears from FIG. 4, the read-out gradient 431' is the inverted version of the read-out gradient 431. Furthermore, the initial read-out gradient 430' is the inverted version of the initial read-out gradient 430. Subsequently, the first and the second series of signal values of the reference set are successively measured, utilizing the read-out gradients $G_{x1}$ and $G_{x2}$. Corresponding echo signals of the two series of the reference set are thus measured with an opposed polarity of the alternating read-out gradient and at substantially corresponding instants relative to the instant at which phase errors due to local frequency deviations are zero. Consequently, the contribution to the phase error by local frequency deviations is the same for each of the corresponding signals of the two series of the reference set. FIG. 5 shows a second version of an EPI reference measurement according to the invention, which version is used preferably when reversal of the read-out gradient according to the first version causes phase differences between the two series of signals other than those for which the correction is suitable. This is the case when the switching of the read-out gradient not only causes the effects to be corrected, having short time constants relative to the duration of a lobe of the read-out gradient, but also effects which have longer time constants in relation to the duration of a lobe of the read-out gradient. The duration of the lobe may be, for example between 1 and 10 ms; a short time constant during the switching of the read-out gradient is, for example 1 ms or less, whereas a long time constant is, for example 10 ms or more. In the latter case the effects due to the reversal of the alternating read-out gradient do not offer a suitable estimate of the phase differences between the transformed signals for positive and negative lobes of the alternating read-out gradient. According to this method a reference measurement is performed by using two excitation RF pulses for the successive measurement of two series of signal values, the read-out gradient for the measurement of the second series of signal values being a time-shifted version of the read-out gradient used for the measurement of the first series of signal values. The line HF in FIG. 5 shows the RF pulse 501 and is identical to the line HF of FIG. 2. Furthermore, the line $G_{x1}$ shows the read-out gradient 531 used for measuring the first series of signal values and the line $G_{x2}$ shows the read-out gradient 531' used for measuring the second series of signal values. The initial read-out gradients 530, 530' in this case are the same, but shifted in time relative to one another. This time shift corresponds to the duration of a single lobe of a read-out gradient 530. The first and the second series of signal values of the reference set are successively measured, using an opposed polarity of the alternating read-out gradient, at substantially corresponding instants relative to an instant at which the phase errors due to local frequency deviations are zero. The measuring values associated with the first lobe of the read-out gradient 531' are not used. The phase error for corresponding signals i and i' of the two series is derived from the formula $\Phi(x)=\arg(S_i^-(x)S_{i'}^{+*}(x))$ where * is the complex conjugate value $S_i^-(x)$ is the Fourier transformed signal of the first series, measured with a negative lobe of the read-out gradient, and $S_{i'}^+(x)$ is the Fourier transformed signal of the second series, measured with a positive lobe of the shifted read-out gradient.

The EPI pulse sequence can also be extended by means of a refocusing RF pulse, the first series then being measured after the excitation RF pulse and the second series after the refocusing pulse. Other combinations of measurements of the signal values of the reference set and the generating of RF pulses are also feasible.

It is a further aspect of the invention that the method can be combined with a method for determining phase errors which is known from the cited document EP-A-644437. According to this method phase errors caused by the alternating of the polarity of the read-out gradient are corrected by phase corrections obtained from a reference set of signal values, measurement then taking place exclusively along a trajectory which includes a few lines in the vicinity of $k_y=0$ in the k-space. All measuring values of the entire set are corrected by means of the phase correction thus obtained. The advantage of the use of this combination according to the invention over the method of the cited document EP-A-644437 consists in that phase errors due to magnetic inhomogeneity and chemical shift are eliminated, so that the calculated phase correction more accurately corresponds to the desired phase correction in respect of delays in the gradients, delays in the transmitter/receiver circuit 9, and delays due to eddy currents caused by the switching of the gradients.

A further possibility consists in the use of a gradient and spin echo multi-echo method (GRASE). A magnetic resonance imaging technique utilizing a pulse sequence which includes an excitation pulse and several refocusing RF pulses is known as "Gradient and Spin Echo" (GRASE). This imaging technique is described in WO/01509. According to the known imaging technique, the magnetic resonance signal is measured at measuring points along substantially parallel lines in the k-space subsequent to the refocusing RF pulse. If not enough measuring values of the magnetic resonance signal can be measured, the signal values associated with further measuring points in the k-space can be measured by repeating the pulse sequence and adapting the phase encoding gradient.

Figure 6:
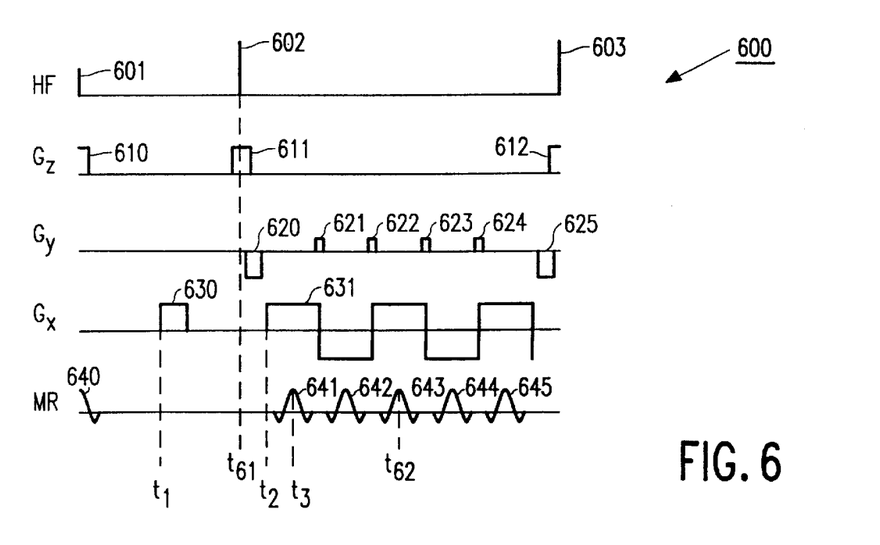
FIG. 6 shows a GRASE pulse sequence.

FIG. 6 shows the use of the method in the known GRASE sequence which is used to generate the gradient echo signals 641, 642, 643, 644, 645 in an object or body so as to perform, for example a two-dimensional Fourier imaging technique. The GRASE pulse sequence 600 commences with an excitation RF pulse 601 having a flip angle α which is succeeded, after an instant $t_{61}$, by a refocusing RF pulse 602 having a flip angle β. The flip angle α is, for example 90°. The flip angle β is, for example 180°. The excitation RF pulse 601 generates a first magnetic resonance signal 640. In FIG. 6 this signal is indicated on line MR. The first magnetic resonance signal 640 quickly decays due to the dephasing of the individual nuclear spins because of local variations in the magnetic field. At the instant $t_{61}$ the excitation RF pulse 601 is succeeded by the refocusing RF pulse 602. The refocusing RF pulse 602 reverses the direction of the individual nuclear spins without disturbing the local magnetic field. Consequently, dephasing is transformed into rephasing so that, in the absence of gradients, a spin echo signal appears after a period $t_{62}$, where $t_{62}=2t_{61}$. However, if an initial read-out gradient 630 is applied at the instant $t_1$ after the excitation RF pulse 601, it also causes dephasing of the nuclear spins. At the instant $t_2$ an alternating read-out gradient 631 is applied, the gradient thereof alternately having positive and negative polarity. The first lobe of the alternating read-out gradient 631 causes rephasing, so that a gradient echo signal 641 arises at the instant $t_3$. Each subsequent lobe causes a further gradient echo signal, so that a series of gradient echo signals 641, 642, 643, 644, 645 is obtained. During application of the initial read-out gradient 630, an initial phase encoding gradient 620 is also applied. Upon reversal of the polarity of the read-out gradient, a further phase encoding gradient pulse (blip) 621, 622, 623, 624 is applied, so that the measured signal values of the gradient echo signals 641, 642, 643, 644, 645 correspond to lines which are uniformly distributed in the k-space and extend parallel to the $k_x$-axis, after each phase encoding gradient pulse there being generated a gradient echo signal whose measured signal values correspond to a next line.

In order to measure further signals of the measuring set, the part of the pulse sequence from the first refocusing RF pulse 602 until the second refocusing RF pulse 603 is repeated a number of times, the initial phase encoding gradient 620 then having different gradients. Using, a compensating pulse 625, it is ensured that for a next refocusing RF pulse 603 the phase returns to a fixed point of the k-space. Finally, if necessary, the entire pulse sequence can be repeated. It is also to be noted that it is not necessary to measure all signals of a measuring set which correspond to a first number of lines which are uniformly distributed in the k-space. It suffices when signals are measured along at least half the first number of lines in the k-space. This offers a saving in respect of measuring time.

Figure 7:
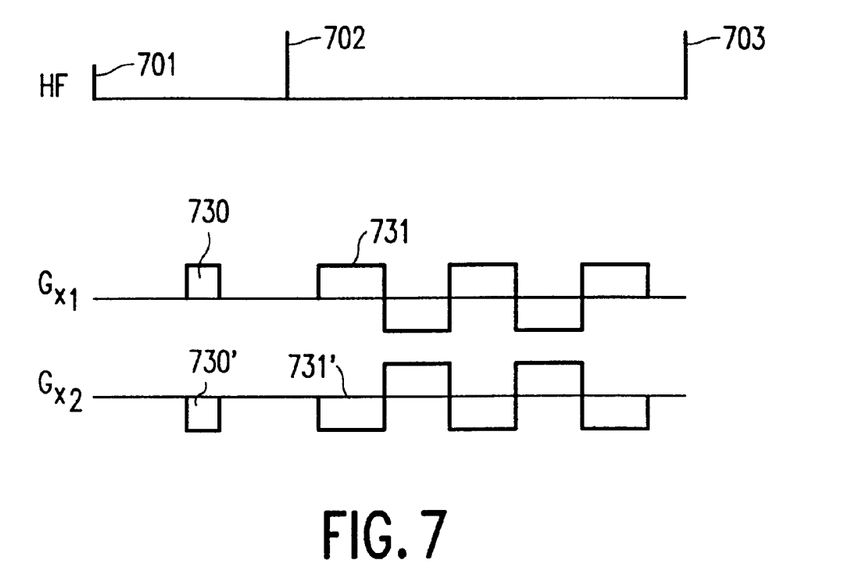
FIG. 7 shows the read-out gradients of a first method for executing GRASE reference measurements.

FIG. 7 shows an example of the read-out gradients of pulse sequences for executing a GRASE reference measurement according to the invention. The line HF in FIG. 7 shows the excitation RF pulse 701 and the refocusing RF pulse 702. For the remainder the line HF is identical to the line HF of FIG. 6. Furthermore, line $G_{x1}$ shows the read-out gradient 730, 731 used for measuring the first series of signal values, and line $G_{x2}$ shows the read-out gradient 730', 731' used for measuring the second series of signal values. FIG. 7 shows that the initial read-out gradient 730' and the read-out gradient 731' are the inverted versions of the initial read-out gradients 730 and 731, respectively.

Figure 8:
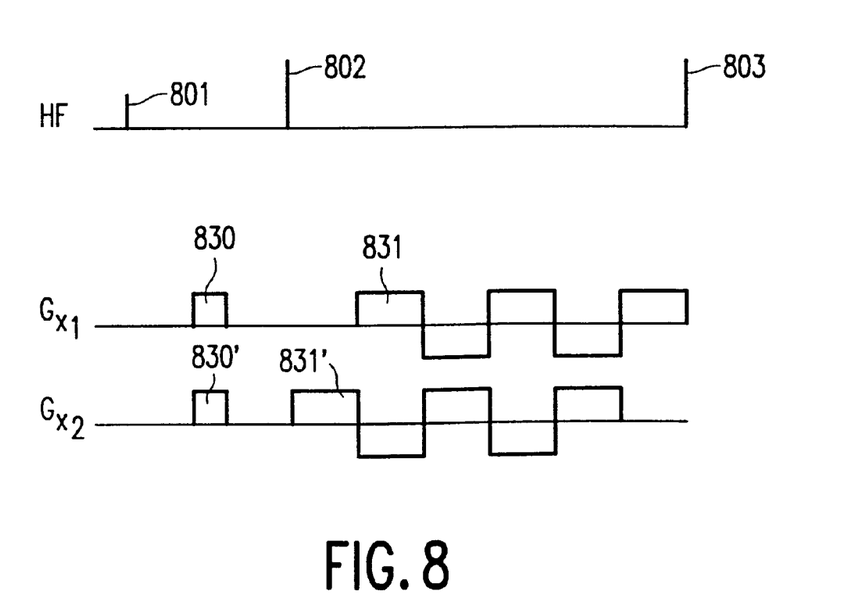
FIG. 8 shows the read-out gradients of a second method for executing GRASE reference measurements.

FIG. 8 shows a second example of the read-out gradients of pulse sequences for carrying out a GRASE reference measurement according to the invention, this is preferably used if the reversal of the gradients 730 and 731 introduces excessive phase differences between corresponding signals of the first and the second series because of longer time constants due to the switching of the read-out gradients. According to this method a reference measurement is performed by applying two successive pulse sequences, each of which contains an excitation RF pulse and a refocusing RF pulse, for measuring two series of signal values, the read-out gradient used during the measurement of the second series of signal values being a time-shifted version of the read-out gradient used during the measurement of the first series of signal values. The line HF in FIG. 8 shows the excitation RF pulse 801, a first refocusing RF pulse 802 and a second refocusing RF pulse 803, and is identical to the line HF of FIG. 6. Furthermore, line $G_{x1}$ shows the first read-out gradient 831 used for measuring the first series of signal values, and line $G_{x2}$ shows the second read-out gradient 831' used for measuring the second series of signal values. The initial read-out gradients 830, 830' are the same in this case. The second read-out gradient 731' is the time-shifted version of the first read-out gradient 731. The time shift corresponds to the duration of a lobe of the first read-out gradient 730. In both cases the first and the second series of signal values of the reference set are measured with opposed polarity of the alternating read-out gradient and at substantially corresponding instants relative to an instant at which the phase errors due to local frequency deviations are zero. The phase error is derived from corresponding gradient echos i and i' by means of the formula:

$$\Phi_i(x) = \arg(S_i^-(x)S_i^{+*}(x)),$$

where * is the complex conjugate value, $S_i^-(x)$ is the Fourier transformed signal of the first series, measured with a negative lobe of the read-out gradient, and $S_i^+(x)$ is the Fourier transformed signal of the second series, measured with a positive lobe of the shifted read-out gradient or inverted read-out gradient.

Another possibility consists in using further refocusing RF pulses in the first pulse sequence, instead of a second pulse sequence, for the measurement of a second series of signal values. It is alternatively possible to measure the first and the second series of signal values of the reference set, immediately after the measurement of the signal values of the set of lines in the k-space, by means of two additional refocusing RF pulses, respectively. Another possibility is to measure a first series of signal values after the first excitation RF pulse and the second series after a refocusing RF pulse. In all said cases the first and second series of signal values of the reference set are measured again with opposed polarity of the alternating read-out gradient and at substantially corresponding instants relative to an instant at which phase errors due to local frequency deviations are zero. Consequently, the contribution to the phase error by corresponding signal values of the two series of the reference set is the same.

What is claimed is:

1. A method of forming a magnetic resonance image of a part of a body situated in a static magnetic field by use of a magnetic resonance signal generated by means of an excitation RF pulse and gradients, the method comprising the steps of:
   a. obtaining a measuring set of echo signal values by application of a read-out gradient in a first direction with an alternating polarity and further gradients on the static magnetic field and the simultaneous measurement of the generated magnetic resonance signal at measuring points along substantially parallel lines in k-space,
   b. determining a phase correction of the measuring set by measuring a reference set of echo signal values,
   c. determining an image by transformation and correction of phase errors by the measuring set of echo signal values,
   d. measuring a first and a second series of echo signal values of the reference set having opposite polarity of the read-out gradient at substantially corresponding instants relative to an instant at which phase errors due to frequency variations are zero, and
   e. deriving the phase correction from a first and a second echo signal value selected from the first and the second series of echo signal values, respectively, measured at said substantially corresponding instants.

2. A method as claimed in claim 1, characterized in that the read-out gradients exhibit the same variation in time but are of opposite polarity during the measurement of the two series of signal values of the reference set.

3. A method as claimed in claim 2, characterized in that the reference set is measured in at least one two-dimensional part of the k-space.

4. A method as claimed in claim 3, characterized in that a refocusing RF pulse is applied subsequent to the excitation RF pulse.

5. A method as claimed in claim 4, characterized in that a further refocusing RF pulse is applied and that the signals of the first series of the reference set are measured after the refocusing RF pulse and the signals of the second series of the reference set are measured after the further refocusing RF pulse.

6. A method as claimed in claim 2, characterized in that a refocusing RF pulse is applied subsequent to the excitation RF pulse.

7. A method as claimed in claim 6, characterized in that a further refocusing RF pulse is applied and that the signals of the first series of the reference set are measured after the refocusing RF pulse and the signals of the second series of the reference set are measured after the further refocusing RF pulse.

8. A method as claimed in claim 1, characterized in that, except for a time shift, the read-out gradients are the same as a function of time during the measurement of the two series of signal values of the reference set.

9. A method as claimed in claim 8, characterized in that the reference set is measured in at least one two-dimensional part of the k-space.

10. A method as claimed in claim 9, characterized in that a refocusing RF pulse is applied subsequent to the excitation RF pulse.

11. A method as claimed in claim 10, characterized in that a further refocusing RF pulse is applied and that the signals of the first series of the reference set are measured after the refocusing RF pulse and the signals of the second series of the reference set are measured after the further refocusing RF pulse.

12. A method as claimed in claim 8, characterized in that a refocusing RF pulse is applied subsequent to the excitation RF pulse.

13. A method as claimed in claim 12, characterized in that a further refocusing RF pulse is applied and that the signals of the first series of the reference set are measured after the refocusing RF pulse and the signals of the second series of the reference set are measured after the further refocusing RF pulse.

14. A method as claimed in claim 1, characterized in that the reference set is measured in at least one two-dimensional part of the k-space.

15. A method as claimed in claim 14, characterized in that a refocusing RF pulse is applied subsequent to the excitation RF pulse.

16. A method as claimed in claim 15, characterized in that a further refocusing RF pulse is applied and that the signals of the first series of the reference set are measured after the refocusing RF pulse and the signals of the second series of the reference set are measured after the further refocusing RF pulse.

17. A method as claimed in claim 1, characterized in that a refocusing RF pulse is applied subsequent to the excitation RF pulse.

18. A method as claimed in claim 17, characterized in that a further refocusing RF pulse is applied and that the signals of the first series of the reference set are measured after the refocusing RF pulse and the signals of the second series of the reference set are measured after the further refocusing RF pulse.

19. A device for forming a magnetic resonance image, comprising:

means for generating RF pulses, means for generating gradients, a control unit for generating control signals for the means for generating the RF pulses and the means for generating the gradient, means for receiving and measuring magnetic resonance signals, and a processing unit for processing the measured magnetic resonance signals, where the control unit is arranged to execute a method which includes the following steps:

a. generating an excitation RF pulse, and b. applying a read-out gradient in a first direction with an alternating polarity and further gradients on the static magnetic field, c. measuring a magnetic resonance signal at measuring points along substantially parallel lines in k-space, thus producing a correction set of echo signal values, d. determining a phase correction by measuring a reference set of echo signal values, e. arranging the control unit to measure a first and a second series of echo signal values of the reference set with opposite polarity of the read-out gradients and at substantially the same instants, relative to an instant at which phase errors due to local frequency deviations are zero, and f. deriving the phase correction from first and second echo signal values derived from the first and the second series of echo signal values, respectively, at substantially the same instants.

\* \* \* \* \*